United States Patent
Kobayashi et al.

(10) Patent No.: US 12,266,939 B2
(45) Date of Patent: Apr. 1, 2025

(54) SMOOTHING-TARGET-VALUE CALCULATION DEVICE, POWER SUPPLY SYSTEM, SMOOTHING-TARGET-VALUE CALCULATION METHOD, AND PROGRAM

(71) Applicant: MITSUBISHI HEAVY INDUSTRIES, LTD., Tokyo (JP)

(72) Inventors: Yu Kobayashi, Tokyo (JP); Yusuke Yashiro, Tokyo (JP); Masayuki Hashimoto, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 18/558,844

(22) PCT Filed: Apr. 25, 2022

(86) PCT No.: PCT/JP2022/018658
§ 371 (c)(1),
(2) Date: Nov. 3, 2023

(87) PCT Pub. No.: WO2022/259778
PCT Pub. Date: Dec. 15, 2022

(65) Prior Publication Data
US 2024/0222977 A1 Jul. 4, 2024

(30) Foreign Application Priority Data
Jun. 8, 2021 (JP) .................. 2021-095605

(51) Int. Cl.
*H02J 3/32* (2006.01)
*G01R 21/00* (2006.01)
(Continued)

(52) U.S. Cl.
CPC ............... *H02J 3/32* (2013.01); *G01R 21/00* (2013.01); *H02J 3/46* (2013.01); *H02J 7/35* (2013.01); *H02J 2300/24* (2020.01)

(58) Field of Classification Search
CPC ........ H02J 3/32; H02J 3/46; H02J 7/35; H02J 2300/24; G01R 21/00
See application file for complete search history.

(56) References Cited

FOREIGN PATENT DOCUMENTS

| JP | 2001-005543 A | 1/2001 |
| JP | 2002-017044 A | 1/2002 |

(Continued)

OTHER PUBLICATIONS

International Search Report dated Jul. 19, 2022, issued in counterpart Application No. PCT/JP2022/018658. (4 pages).
(Continued)

*Primary Examiner* — Robert L Deberadinis
(74) *Attorney, Agent, or Firm* — WHDA, LLP (57) ABSTRACT

Provided is a smoothing-target-value calculation device that is capable of calculating a smoothing target value with which it is possible to suppress battery degradation. The present invention provides a smoothing-target-value calculation device that calculates a smoothing target value, which is a target value for the sum of first power generated by a renewable-energy power generation system and second power charged into and discharged from a battery, the smoothing-target-value calculation device including: a predicted-value acquisition unit that acquires a predicted value for the first power; a predicted-value correction unit that corrects the predicted value; and a smoothing-target-value calculation unit that calculates a smoothing target value by smoothing the corrected predicted value.

9 Claims, 8 Drawing Sheets

(51) Int. Cl.
   *H02J 3/46*   (2006.01)
   *H02J 7/35*   (2006.01)

(56)     References Cited

FOREIGN PATENT DOCUMENTS

JP      2018160993 A  * 10/2018
JP         6768571 B2   10/2020
WO      2011/093362 A1    8/2011

OTHER PUBLICATIONS

Written Opinion dated Jul. 19, 2022, issued in counterpart Application No. PCT/JP2022/018658, with English Translation. (8 pages).

* cited by examiner

SMOOTHING-TARGET-VALUE CALCULATION DEVICE, POWER SUPPLY SYSTEM, SMOOTHING-TARGET-VALUE CALCULATION METHOD, AND PROGRAM

TECHNICAL FIELD

The present disclosure relates to a smoothing-target-value calculation device, a power supply system, a smoothing-target-value calculation method, and a program. Priority is claimed to Japanese Patent Application No. 2021-095605, filed Jun. 8, 2021, the contents of which are incorporated herein by reference.

BACKGROUND ART

Provided is a technique of suppressing output fluctuation of renewable-energy power generation, such as solar power generation or wind power generation, by charging and discharging from a secondary battery. For example, PTL 1 discloses a method of predicting power generated by renewable energy, setting power obtained by combining a predicted value of the generated power and charge/discharge power from the secondary battery as a target value, and controlling the charging and discharging of the secondary battery such that fluctuation in the power generated by renewable energy is suppressed within a predetermined range.

CITATION LIST

Patent Literature

[PTL 1] Japanese Patent No. 6768571

SUMMARY OF INVENTION

Technical Problem

In a case where an output target value is set based on the predicted value of the power generated by the renewable energy and charge/discharge control of the secondary battery is performed to achieve the target value, a charge/discharge amount of the secondary battery increases, which results in degradation of the secondary battery, in a case of using the generated power with low prediction accuracy.

The present disclosure provides a smoothing-target-value calculation device, a power supply system, a smoothing-target-value calculation method, and a program capable of solving the above problems.

Solution to Problem

According to one aspect of the present disclosure, a smoothing-target-value calculation device is a smoothing-target-value calculation device that calculates a smoothing target value, which is a target value of power obtained by totaling first power generated by a renewable-energy power generation system and second power charged and discharged by a battery, the device including a predicted-value acquisition unit that acquires a predicted value of the first power, a predicted-value correction unit that corrects the predicted value, and a smoothing-target-value calculation unit that smooths the predicted value after the correction to calculate the smoothing target value.

According to one aspect of the present disclosure, a smoothing-target-value calculation device is a smoothing-target-value calculation device that calculates a smoothing target value, which is a target value of power obtained by totaling first power generated by a renewable-energy power generation system and second power charged and discharged by a battery, the device including a method selection unit that selects a method of calculating the smoothing target value, in which the method selection unit selects, in a case where a daily total of the predicted values of the first power exceeds a threshold value, a method in which the predicted value is smoothed to calculate the smoothing target value, and selects, in a case where the daily total of the predicted values of the first power is equal to or less than the threshold value, a method in which a moving average value of an actual value of the first power is calculated to calculate the smoothing target value.

A power supply system according to the present disclosure includes a renewable-energy power generation system, a battery system that charges and discharges a battery to compensate for output fluctuation of the renewable-energy power generation system, and any one of the smoothing-target-value calculation devices, in which the battery system charges and discharges the battery based on a difference between the smoothing target value calculated by the smoothing-target-value calculation device and power generated by the renewable-energy power generation system.

A smoothing-target-value calculation method of the present disclosure is a smoothing-target-value calculation method of calculating a smoothing target value, which is a target value of power obtained by totaling first power generated by a renewable-energy power generation system and second power charged and discharged by a battery, the method including a step of acquiring a predicted value of the first power, a step of correcting the predicted value, and a step of smoothing the predicted value after the correction to calculate the smoothing target value.

A program of the present disclosure causes a computer that calculates a smoothing target value, which is a target value of power obtained by totaling first power generated by a renewable-energy power generation system and second power charged and discharged by a battery, to execute a step of acquiring a predicted value of the first power, a step of correcting the predicted value, and a step of smoothing the predicted value after the correction to calculate the smoothing target value.

Advantageous Effects of Invention

With the smoothing-target-value calculation device, the power supply system, the smoothing-target-value calculation method, and the program, it is possible to suppress the degradation of the secondary battery while achieving the output fluctuation suppression of the renewable-energy power generation.

DESCRIPTION OF EMBODIMENTS

Hereinafter, a power supply system 100 of the present disclosure will be described with reference to FIGS. 1 to 10. In the following description, the same reference numerals are assigned to configurations having the same or similar functions. Redundant descriptions of such configurations may be omitted.

(System Configuration)

Figure 1:
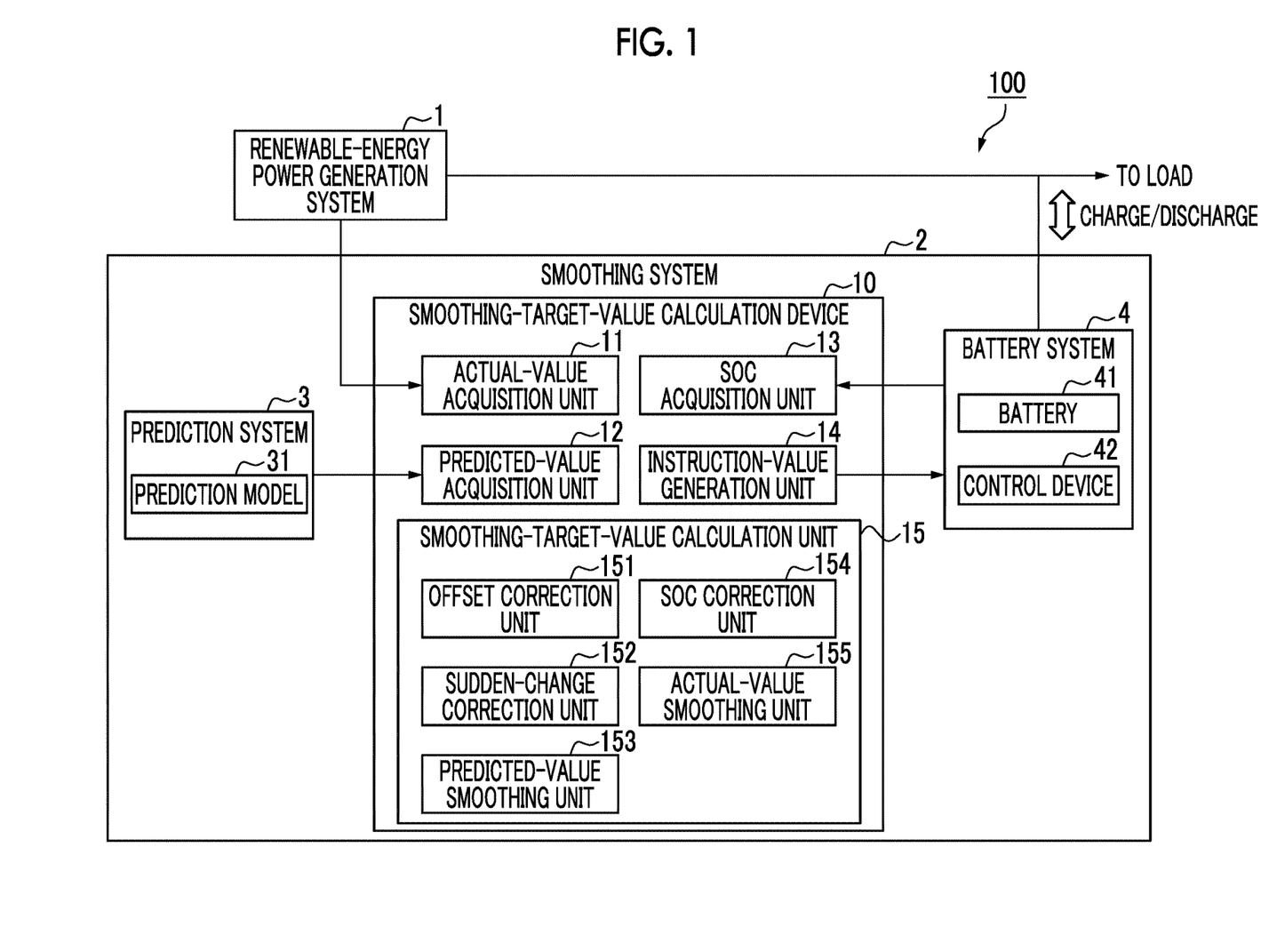
FIG. 1 is a diagram showing an example of a power supply system according to each embodiment.

FIG. 1 is a diagram showing an example of a power supply system according to a first embodiment.

The power supply system 100 includes a renewable-energy power generation system 1 such as solar power generation, wind power generation, hydraulic power generation, geothermal power generation, and biomass power generation, and a smoothing system 2. The smoothing system 2 smooths fluctuation in an output (generated power) of the renewable-energy power generation system 1. The power supply system 100 supplies power generated by the renewable-energy power generation system 1 and smoothed by the smoothing system 2 to a load such as a facility, such as a factory, or a commercial power system. The smoothing system 2 includes a prediction system 3, a smoothing-target-value calculation device 10, and a battery system 4.

The prediction system 3 predicts, based on an actual value of the power generated in the past by the renewable-energy power generation system 1, the power generated by the renewable-energy power generation system 1 in the future. Hereinafter, the power generated by the renewable-energy power generation system 1 is abbreviated as PV power (PV is an abbreviation for photovoltaic, but the scope of application of the present disclosure is not limited to solar power generation), and a power amount is abbreviated as a PV power amount. For example, the prediction system 3 has a prediction model 31 in which the actual value or the like of the PV power in a certain time zone in the past (one day ago, one week ago, or the like) is used as an explanatory variable, the actual value of the PV power in the same time zone on another day is used as an objective variable, and a relationship between the variables is learned by a random forest or the like. The prediction system 3 predicts, by the prediction model 31, the PV power for each corresponding time on the current day from the actual value of the PV power for each predetermined time in the past (for example, every 30 minutes of previous day). The prediction system 3 predicts the PV power amount of the next day based on a total PV power amount generated on the current day at the end of one day.

The smoothing-target-value calculation device 10 acquires a predicted value of the PV power predicted by the prediction system 3 from the prediction system 3 and acquires the actual value of the PV power from the renewable-energy power generation system 1. The smoothing-target-value calculation device 10 corrects or the like the predicted value of the PV power based on the actual value of the PV power and calculates a target value of the power supplied to the load by the power supply system 100. This target value is referred to as a smoothing target value. The battery system 4 is a battery energy storage system (BESS: secondary battery power storage system). The battery system 4 plays a role of absorbing and stabilizing output fluctuation of the renewable-energy power generation system 1. The battery system 4 includes a battery 41 and a control device 42. The battery 41 is a secondary battery such as one or a plurality of lithium batteries or a lead battery. The control device 42 performs charge/discharge control of the battery 41 or monitoring of state of charge (SOC). The control device 42 acquires a charge/discharge instruction value from the smoothing-target-value calculation device 10 and controls charging and discharging of the battery 41 such that the power supplied to the load from the power supply system 100 is the smoothing target value. The control device 42 controls the charging and discharging of the battery 41 such that the SOC of the battery 41 reaches a predetermined target value (for example, 50%). The smoothing-target-value calculation device 10 calculates the smoothing target value such that the SOC of the battery 41 is the target value while stably supplying the power generated by the renewable-energy power generation system 1. Accordingly, it is possible to suppress degradation of the battery 41 while suppressing the fluctuation of a PV power generation amount. Next, the smoothing-target-value calculation device 10 will be described in more detail.

The smoothing-target-value calculation device 10 is provided with an actual-value acquisition unit 11, a predicted-value acquisition unit 12, an SOC acquisition unit 13, an instruction-value generation unit 14, and a smoothing-target-value calculation unit 15.

The actual-value acquisition unit 11 acquires and stores the latest actual value of the PV power from the renewable-energy power generation system 1 at a predetermined control cycle. For example, the actual-value acquisition unit 11 acquires the actual value of the PV power moment by moment.

The predicted-value acquisition unit 12 acquires and stores the predicted value of the PV power from the prediction system 3. For example, an average predicted value at each time point in a predetermined time (30 minutes) is provided as the predicted value of the PV power.

The SOC acquisition unit 13 acquires the latest SOC of the battery 41 from the battery system 4 at a predetermined control cycle. The SOC acquisition unit 13 outputs the acquired SOC to an SOC correction unit 154.

The instruction-value generation unit 14 generates the charge/discharge instruction value to be output to the battery system 4. The instruction-value generation unit 14 subtracts the actual value of the PV power from the smoothing target value to generate the charge/discharge instruction value.

The smoothing-target-value calculation unit 15 calculates the smoothing target value. As described below in a third embodiment, the smoothing-target-value calculation unit 15 selects any one of a method of calculating the smoothing target value based on the predicted value of the PV power or a method in the related art of calculating the smoothing target value based on the actual value of the PV power to calculate the smoothing target value for each predetermined time. Roughly speaking, a value obtained by smoothing the predicted value of the PV power for each predetermined time is the smoothing target value based on the predicted value, and a value obtained by smoothing the actual value of the PV power is the smoothing target value based on the actual value. However, since there is always an error between the predicted value of the PV power by the prediction system 3 and the actual value, the smoothing-target-value calculation unit 15 corrects the predicted value of the PV power such that this error is reduced and calculates the smoothing target value based on the predicted value. In a case where it is considered that the PV power slightly ahead can be predicted more accurately by using the actual value of the PV power of the current day rather than using the predicted value of the PV power, the smoothing-target-value calculation unit 15 calculates the smoothing target value (smoothing target value based on actual value) based on the actual value of the PV power.

The smoothing-target-value calculation unit 15 is provided with an offset correction unit 151, a sudden-change correction unit 152, a predicted-value smoothing unit 153, an SOC correction unit 154, and an actual-value smoothing unit 155.

The offset correction unit 151 corrects the predicted value of the PV power slightly ahead based on a difference between the actual value and the predicted value of the PV power slightly before. This correction is referred to as offset correction. The offset correction will be described in a first embodiment.

In a case where the predicted value of the PV power is estimated to deviate significantly from the actual value, the sudden-change correction unit 152 corrects the predicted value of the PV power based on preceding and subsequent predicted values of the predicted value. This correction is referred to as predicted-value sudden-change correction. The predicted-value sudden-change correction will be described in a second embodiment.

The predicted-value smoothing unit 153 smooths the predicted value (predicted value after the correction) of the PV power in a time series. A smoothed value is the smoothing target value. This smoothing process will be described in the first embodiment.

The SOC correction unit 154 performs addition/subtraction of the power to be charged and discharged to bring the SOC of the battery 41 close to the SOC target value to correct the predicted value of the PV power.

The actual-value smoothing unit 155 calculates a moving average value of the actual value of the PV power to smooth the actual value of the PV power.

First Embodiment (Offset Correction)

Next, the offset correction according to the first embodiment will be described with reference to FIG. 2.

Figure 2:
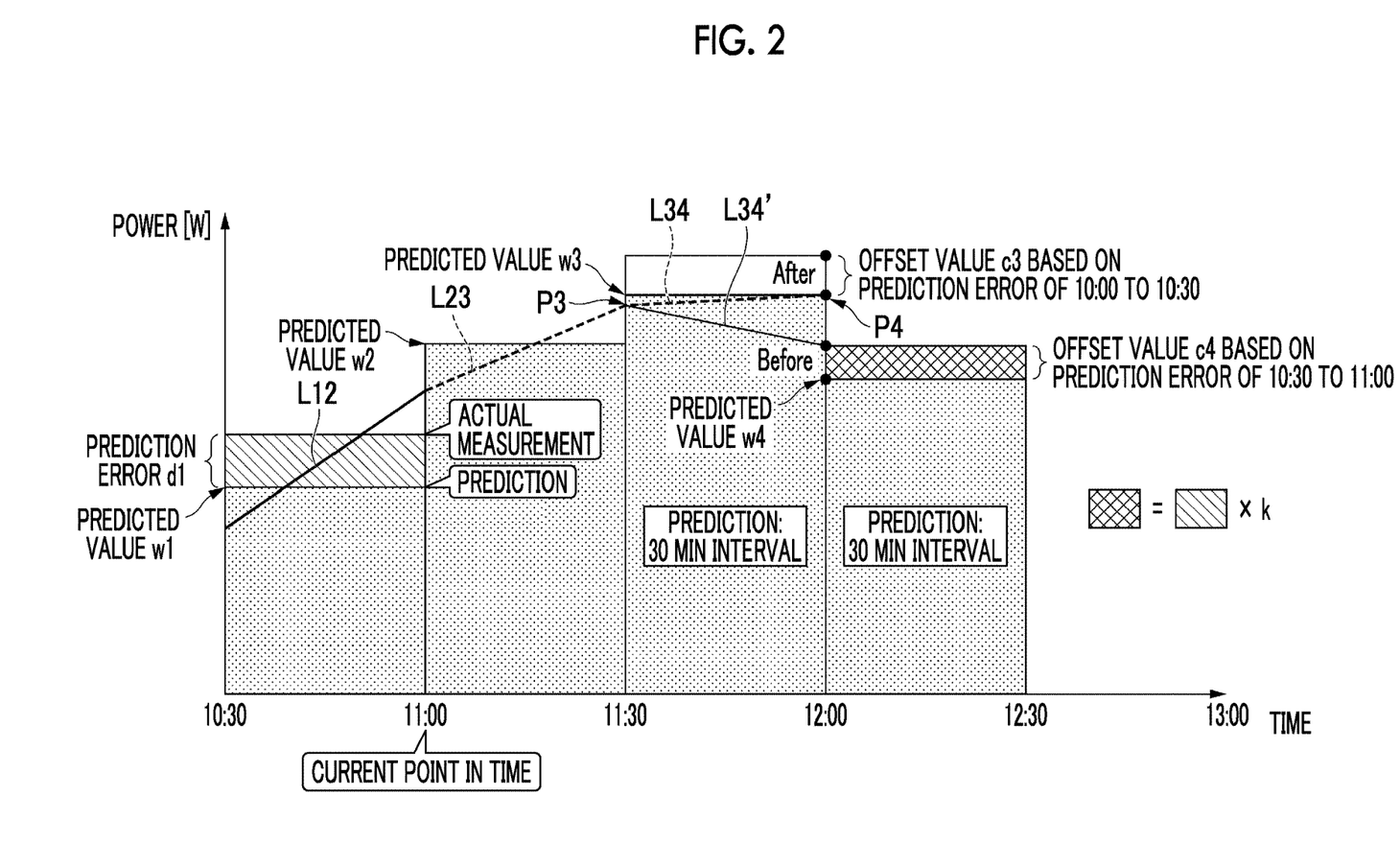
FIG. 2 is a diagram for describing offset correction according to a first embodiment.

In a graph of FIG. 2, the vertical axis indicates PV power and the horizontal axis indicates time. The prediction system 3 predicts the PV power every 30 minutes. For example, at the beginning of one day, the prediction system 3 predicts the predicted value of the PV power every 30 minutes in the same time zone of the current day, based on the actual value of the PV power every 30 minutes of the previous day. For example, average PV power w1 at each time point from 10:30 to 11:00 of the current day is predicted based on the actual value of the PV power from 10:30 to 11:00 of the previous day. Similarly, the prediction system 3 predicts PV power w2 from 11:00 to 11:30, PV power w3 from 11:30 to 12:00, and PV power w4 from 12:00 to 12:30. Here, a case where the predicted values of the PV power w1 to the PV power w4 are set as they are as the smoothing target value will be considered as a simple example. For example, assuming that each of the predicted values of the PV power w1 to the PV power w4 is 100 and the actual value of the current day is 50, the battery system 4 is required to continue to discharge the power compensating for the difference from the battery 41, and a use range of the battery 41 (allowable range of SOC) may be deviated. On the contrary, in such a case where the actual value continues to exceed the predicted value such as a case where each of the actual values of the PV power w1 to the PV power w4 is 150, the battery 41 is required to continue to be charged, and the use range of the battery 41 may be significantly deviated again. In a case where such charging and discharging are repeated, the degradation of the battery 41 is promoted. In the present embodiment, the offset correction unit 151 corrects the predicted value of the PV power slightly ahead based on the difference between the predicted value of the PV power and the actual value thereof.

For example, a current point in time is assumed to be 11 o'clock. In this case, the prediction system 3 has already calculated the predicted values of the PV power w1 to the PV power w4, and the actual value of the PV power w1 has been clarified for the PV power w1 (10:30 to 11:00). For example, it is assumed that the actual value of the PV power w1 exceeds the predicted value and the difference between the actual value and the predicted value is d1. The offset correction unit 151 adds an offset value (d1×k) obtained by multiplying the difference d1 by a predetermined coefficient k to the predicted value three frames ahead, that is, the predicted value of the PV power w4 from 12:00 to 12:30. Here, the reason why the addition is performed on the predicted value three frames ahead is that the control is required to be started based on the already set smoothing target value for 11:00 to 11:30 next (one frame ahead) and the smoothing target value at a start time point of 11:30, for 11:30 to 12:00 two frames ahead, is also the smoothing target value at a final time point of the immediately preceding frame and thus is not appropriate to be changed. Although not illustrated, the offset correction for the PV power w2 is executed at a point in time of 10 o'clock based on the difference of 9:30 to 10:00, and the offset correction for the PV power w3 is executed at a point in time of 10:30 based on the difference of 10:00 to 10:30.

In a case where the actual value of the PV power w1 falls below the predicted value, the offset correction unit 151 subtracts the offset value (d1×k) obtained by multiplying the difference d1 by the predetermined coefficient k from the predicted value of the PV power w4. Similarly, the offset correction unit 151 performs, at 11:30, the offset correction on the predicted value of PV power w5 of 12:30 to 13:00 (not shown) based on a difference d2 between the actual value and the predicted value of the PV power w2. Accordingly, in such a case where there are consecutive time zones (frames) in which the actual value exceeds or falls below the predicted value, or there are unilaterally many time zones (frames) in which the actual value exceeds or falls below the predicted value (even though time zones are not continuous), the predicted value in advance can be brought close to the actual value. Accordingly, it is possible to suppress a charge/discharge amount of the battery 41. For example, in such a case where the solar power generation is used and the weather is cloudy on the previous day and sunny on the current day, the predicted value of the PV power predicted by the prediction system 3, based on the actual value of the previous day, may be lower than the actual value of the current day throughout one day. In such a case, with the addition of the offset value to the predicted value of the PV power by the offset correction in the present embodiment, it is possible to bring the predicted value close to the actual value and suppress the charge/discharge amount.

The reason why the difference d1 is multiplied by the coefficient k is to deal with a problem that, for example, in a case where there is behavior such that the predicted value exceeds the actual value in certain 30 minutes, the actual value exceeds the predicted value in next 30 minutes, and the predicted value exceeds the actual value in another next 30 minutes, the difference between the predicted value and the actual value is large on the contrary due to the offset correction, which has an adverse effect. For example, with multiplication of k by a value smaller than 1 (such as 0.5), the risk of the adverse effect can be reduced.

(Smoothing Process)

Next, a smoothing process for the predicted value of the PV power will be described. For example, the present time is assumed to be 11 o'clock. Lines L12 and L23 in FIG. 2 are smoothing target values calculated in the past time zone. The predicted-value smoothing unit 153 connects a point P3 at an end point in time of the line L23, which is already calculated, and a point P4 which is an average value of the predicted value of the PV power w3 after the offset correction and the predicted value of the PV power w4 after the offset correction, and a line L34 obtained by connecting the points P3 and P4 is set as the smoothing target value. In this way, in a case where the predicted value of the PV power is obtained for each predetermined time (30 minutes), a process of connecting the average value of the predicted values of the PV power after the offset correction in adjacent time zones is referred to as the smoothing process of the predicted value. In the example of FIG. 2, an average value of the PV power w2 and the PV power w3 after the offset correction in adjacent time zones is the point P3, and the average value of the PV power w3 after the offset correction and the PV power w4 after the offset correction in adjacent time zones is the point P4. The process of connecting the points P3 and P4 is the smoothing process. The line formed by the smoothing process indicates the smoothing target value at that time. For comparison, a line L34' created by using the predicted values of the PV power w3 and the PV power w4 before the offset correction is shown.

(Operation)

Figure 3:
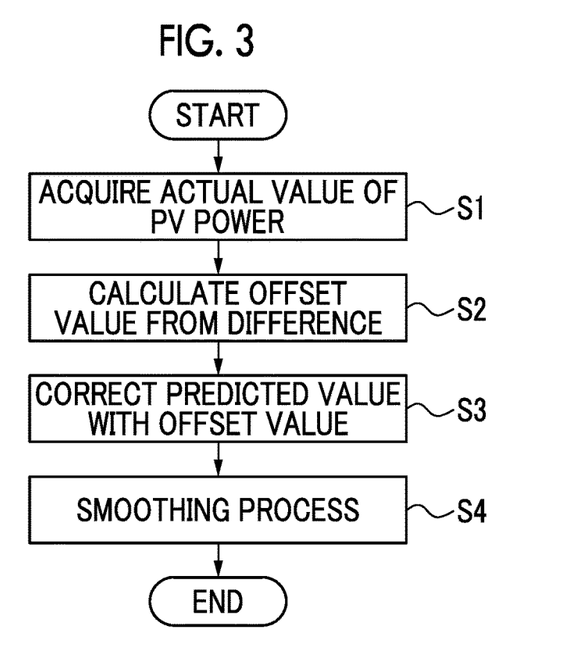
FIG. 3 is a diagram showing an example of a smoothing-target-value calculation process according to the first embodiment.

FIG. 3 shows the flow of offset correction and a smoothing-target-value calculation process. The predicted-value acquisition unit 12 acquires and stores the predicted value of the PV power every 30 minutes in advance. The actual-value acquisition unit 11 acquires the actual value of the PV power every 30 minutes of a control day (step S1). Next, the offset correction unit 151 calculates the difference d between the actual value and the predicted value of the PV power for 30 minutes immediately before. The offset correction unit 151 calculates the offset value by multiplying the difference d by the coefficient k (step S2). Next, in the offset correction unit 151, the offset value calculated in step S2 is added to or subtracted from the predicted value of the PV power in the time zone (frame) three ahead to perform the offset correction on the predicted value (step S3). Next, the predicted-value smoothing unit 153 executes the smoothing process (step S4). For example, in the predicted-value smoothing unit 153, for time 1, time 2, and time 3, which are three consecutive time zones every 30 minutes, an average value P1 of the predicted value of the PV power after the offset correction in time 1 and the predicted value of the PV power after the offset correction in time 2 is set as the smoothing target value of the PV power at a time point of a boundary between time 1 and time 2. In the predicted-value smoothing unit 153, an average value P2 of the predicted value of the PV power after the offset correction in time 2 and the predicted value of the PV power after the offset correction in time 3 is set as the smoothing target value of the PV power at a time point of a boundary between time 2 and time 3. The predicted-value smoothing unit 153 connects the average value P1 and the average value P2 to set the smoothing target value in time 2. The time-series smoothing target value created in this manner is the smoothing target value based on the predicted value of the PV power. The instruction-value generation unit 14 calculates a difference between the smoothing target value moment by moment and the actual value of the PV power moment by moment, and generates the charge/discharge instruction value that compensates for the difference. In the battery system 4, the control device 42 performs the charging and discharging of the battery 41 based on the charge/discharge instruction value calculated by the instruction-value generation unit 14. Accordingly, the power indicated by the smoothing target value is supplied to the load.

In the above description, the difference d1 between the actual value and the predicted value of the PV power w1 (predicted value without offset correction) is calculated. However, for the predicted value of 10:30 to 11:00, the offset value for the PV power w1 is also calculated at the time (9:30), which is before 10:30 to 11:00, and thus a difference d1' between the actual value and the predicted value after the offset correction of the PV power w1 may be calculated and the offset value may be calculated by (d1'×k).

According to the present embodiment, with continuation of the prediction error on any one of upper or lower side, it is possible to reduce the risk of deviation from an upper limit or a lower limit of the use range of the battery 41. Accordingly, it is possible to suppress the degradation of the battery 41.

Second Embodiment

Figure 4:
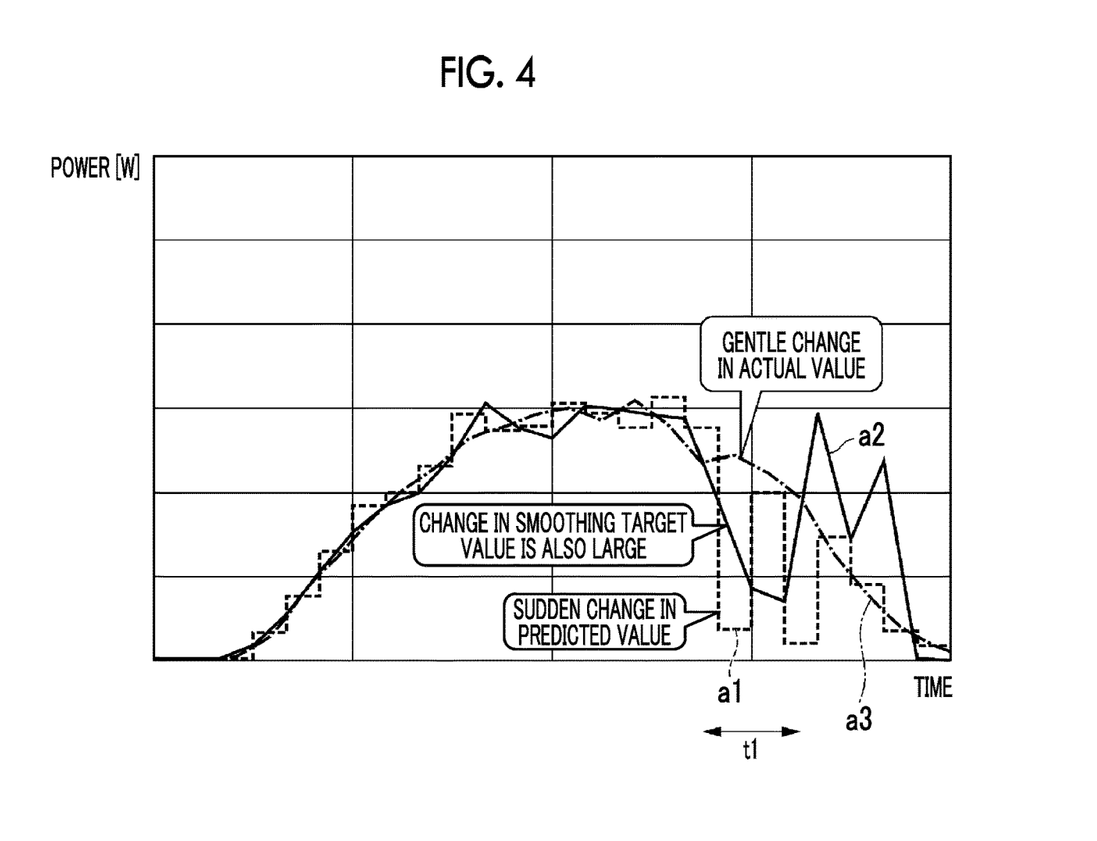
FIG. 4 is a diagram for describing a sudden change in a predicted value according to a second embodiment.

Next, the predicted-value sudden-change correction according to the second embodiment will be described with reference to FIGS. 4 to 6. In the prediction model 31 used by the prediction system 3 for the prediction of the PV power, a past actual value of a time to be predicted is a main explanatory variable. This is because a model with higher prediction accuracy as a whole can be obtained by using the past actual value in the same time zone as the main explanatory variable rather than the actual value or the predicted value at a time point immediately before. For this reason, for example, in a case where there is a sudden change in the past actual value used for the explanatory variable, the sudden change also appears in a prediction result. This situation is shown in FIG. 4. A broken line graph a1 shows the predicted value of the PV power predicted by the prediction system 3, and a solid line graph a2 shows the smoothing target value obtained by performing the offset correction or the smoothing process on the predicted value of the PV power. As illustrated in the figure, the smoothing target value shows sudden decrease and increase in a time zone t1. On the contrary, a solid line graph a3 shows the actual value of the PV power and shows a gentle change in the time zone t1. As illustrated in FIG. 4, the sudden change in the actual PV power rarely occurs actually. Thus, the sudden change in the predicted value of the PV power based on characteristics of the prediction model causes unnecessary charging and discharging for the battery 41. In the second embodiment, the sudden change in the predicted value by the prediction system 3 is corrected to prevent an increase in the charge/discharge amount from the battery 41. This correction is referred to as the predicted-value sudden-change correction.

A process of the predicted-value sudden-change correction will be described with reference to FIGS. 5 and 6. FIG. 5 shows an example of the predicted value of the PV power every 30 minutes from 10:30 to 12:30. FIG. 6 shows a flow of the process of the predicted-value sudden-change correction.

Figure 5:
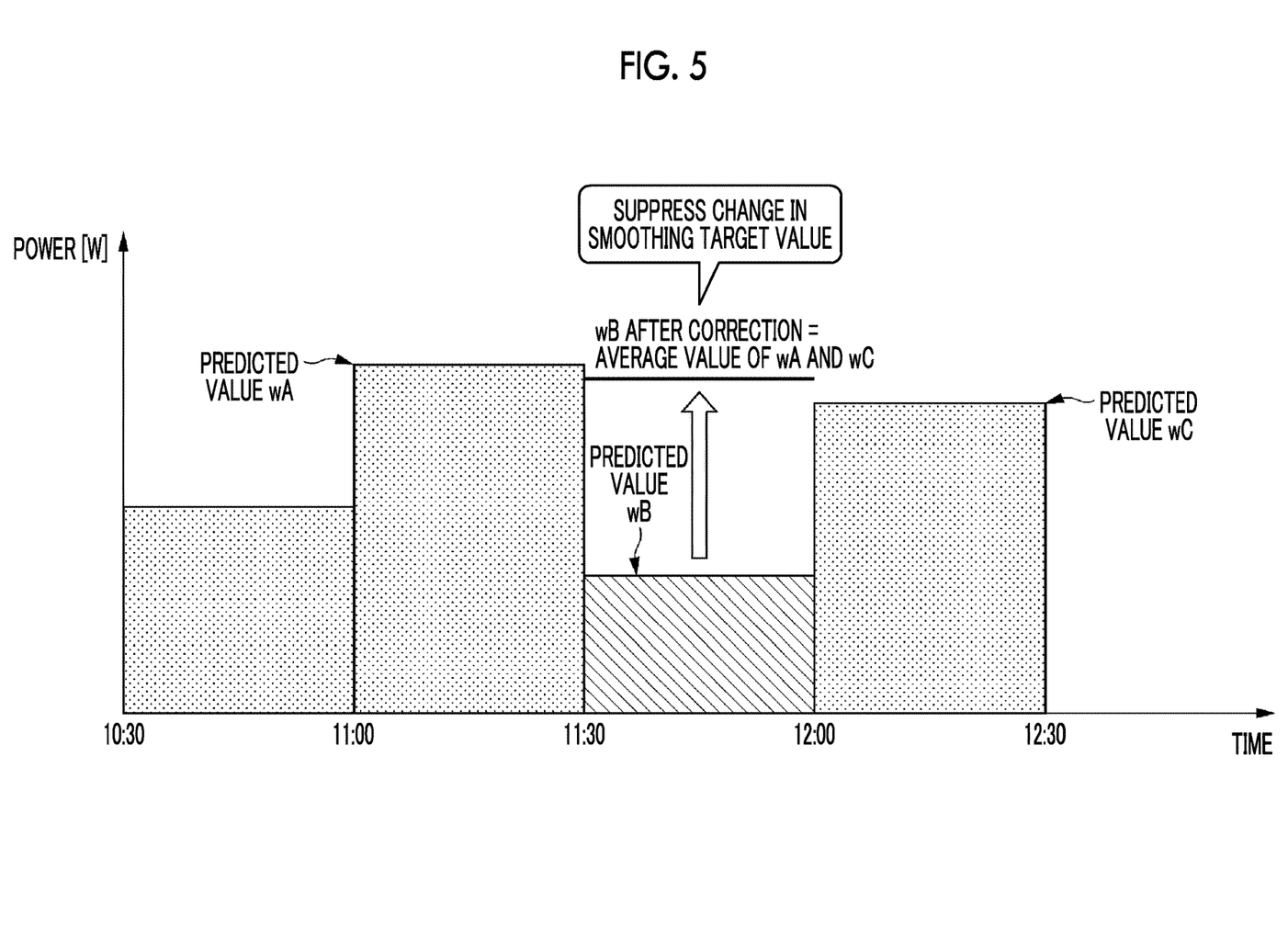
FIG. 5 is a diagram for describing predicted-value sudden-change correction according to the second embodiment.
Figure 6:
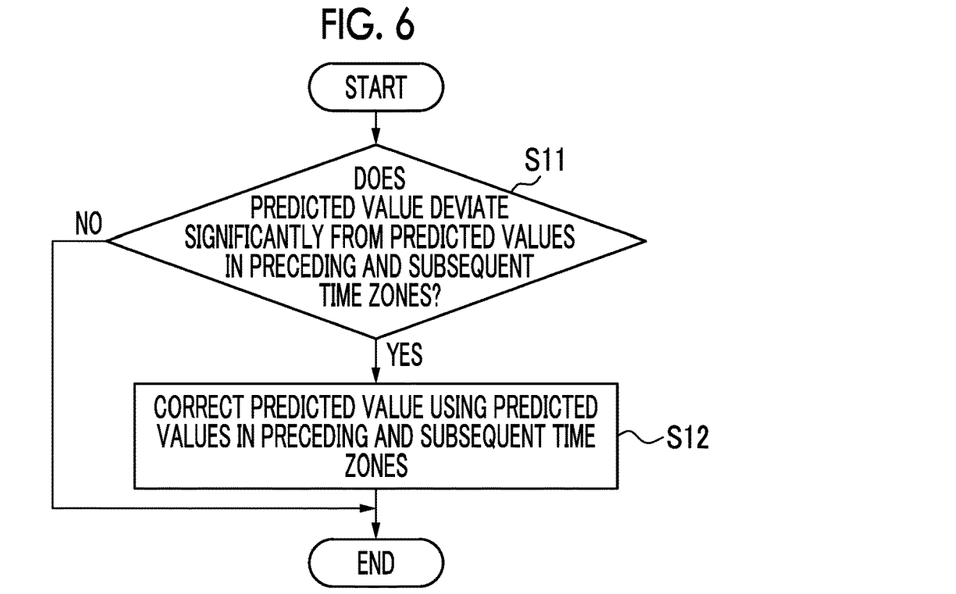
FIG. 6 is a flowchart showing an example of a predicted-value sudden-change correction process according to the second embodiment.

In the example of FIG. 5, a predicted value wB of 11:30 to 12:00 is dropped significantly compared with a predicted value wA of 11:00 to 11:30 and a predicted value wC of 12:00 to 12:30. As in this example, in a case where the predicted value in a certain time zone deviates significantly from the predicted values in time zones before and after the certain time zone, the sudden-change correction unit 152 corrects the predicted value in the certain time zone. Specifically, first, the sudden-change correction unit 152 determines whether or not the predicted value in the certain time zone deviates significantly from the predicted values in the time zones before and after the certain time zone (step S11). The predicted value of the PV power in the certain time zone t is represented by a predicted value (t), and the predicted values of the PV power in the time zones before and after the certain time zone are respectively represented by a predicted value (t−1) and a predicted value (t+1), and a predetermined threshold value is set as Th. The sudden-change correction unit 152 determines whether or not the following Equation (1) or Equation (1') is satisfied.

Predicted value $(t) + Th <$ (1.)
$\quad$ (predicted value $(t-1)$ + predicted value $(t+1)) \div 2$ Predicted value $(t) - Th >$ (1')
$\quad$ (predicted value $(t-1)$ + predicted value $(t+1)) \div 2$ In the example of FIG. 5, the sudden-change correction unit 152 determines whether or not any one of $wB + Th < (wA + wC) \div 2$ or $wB - Th > (wA + wC) \div 2$ is satisfied.

In a case where there is a significant deviation (step S11; Yes), that is, in a case where any one of Equation (1) or Equation (1') is satisfied, the sudden-change correction unit 152 corrects the predicted value (t) using the predicted value (t−1) and the predicted value (t+1) in the time zones before and after the certain time zone (step S12). Specifically, the sudden-change correction unit 152 corrects the predicted value (t) by the following Equation (2).

Predicted value after correction $(t) =$ (2)
$\quad$ (predicted value $(t-1)$ + predicted value $(t+1)) \div 2$ In the example of FIG. 5, the sudden-change correction unit 152 calculates the predicted value wB after the predicted-value sudden-change correction by wB=(wA+wC)÷2 after the correction.

Modification Example

A value of the predicted value (t) after the correction is not limited to Equation (2) and may be a value that falls within a predetermined range based on a calculation result of Equation (2). For example, in the sudden-change correction unit 152, a predetermined correction amount may be added to or subtracted from the calculation result of Equation (2) to calculate the predicted value (t) after the correction. In the above example, in a case where the predicted value (t) in the intermediate time for consecutive times every 30 minutes deviates from the average value of the predicted value (t−1) or the predicted value (t+1), the predicted-value sudden-change correction is performed. For example, in such a case where among four consecutive times such as the predicted value (t−1), the predicted value (t), the predicted value (t+1), and a predicted value (t+2), both the predicted value (t) and the predicted value (t+1) satisfy Equation (1) or Equation (1') between the predicted value (t−1) and the predicted value (t+2), both the predicted value (t) and the predicted value (t+1) may be corrected by a value based on Equation (2). For example, in FIG. 5, in such a case where both the predicted value of 10:30 to 11:00 and the predicted value of 12:00 to 12:30 are large values and both the predicted value of 11:00 to 11:30 and the predicted value of 11:30 to 12:00 are extremely small values, the predicted values of 11:00 to 12:00 for two frames may be corrected based on Equation (2).

In a case where there is no significant deviation (step S11; No), that is, in a case where neither Equation (1) nor Equation (1') is satisfied, the sudden-change correction unit 152 does not correct the predicted value (t) of the PV power. Next, the predicted-value smoothing unit 153 performs the smoothing process (step S4) to calculate the smoothing target value (regardless of whether or not the predicted-value sudden-change correction is executed).

According to the present embodiment, with avoidance of the originally unnecessary charging and discharging caused by characteristics of the prediction model 31, it is possible to suppress the degradation of the battery 41. The second embodiment can be combined with the first embodiment. In this case, the smoothing-target-value calculation device 10 performs the predicted-value sudden-change correction (steps S11 to S12) on the predicted value predicted by the prediction system 3 and performs the offset correction (step S3) and the smoothing process (step S4) on the result of the predicted-value sudden-change correction to calculate the smoothing target value.

Third Embodiment

In the first embodiment and the second embodiment, the method has been described in which the predicted value of the PV power is corrected and the smoothing process is performed on the predicted value of the PV power after the correction to improve the accuracy of the smoothing target value and to suppress the charging and discharging of the battery 41. On the contrary, in the third embodiment, a method will be described in which, in a case where the PV power can be accurately predicted with calculation of the smoothing target value based on the actual value of the PV power in the time zone slightly before on the same day, as compared with the predicted value of the PV power, the actual value of the PV power is smoothed to calculate the smoothing target value.

Figure 7A:
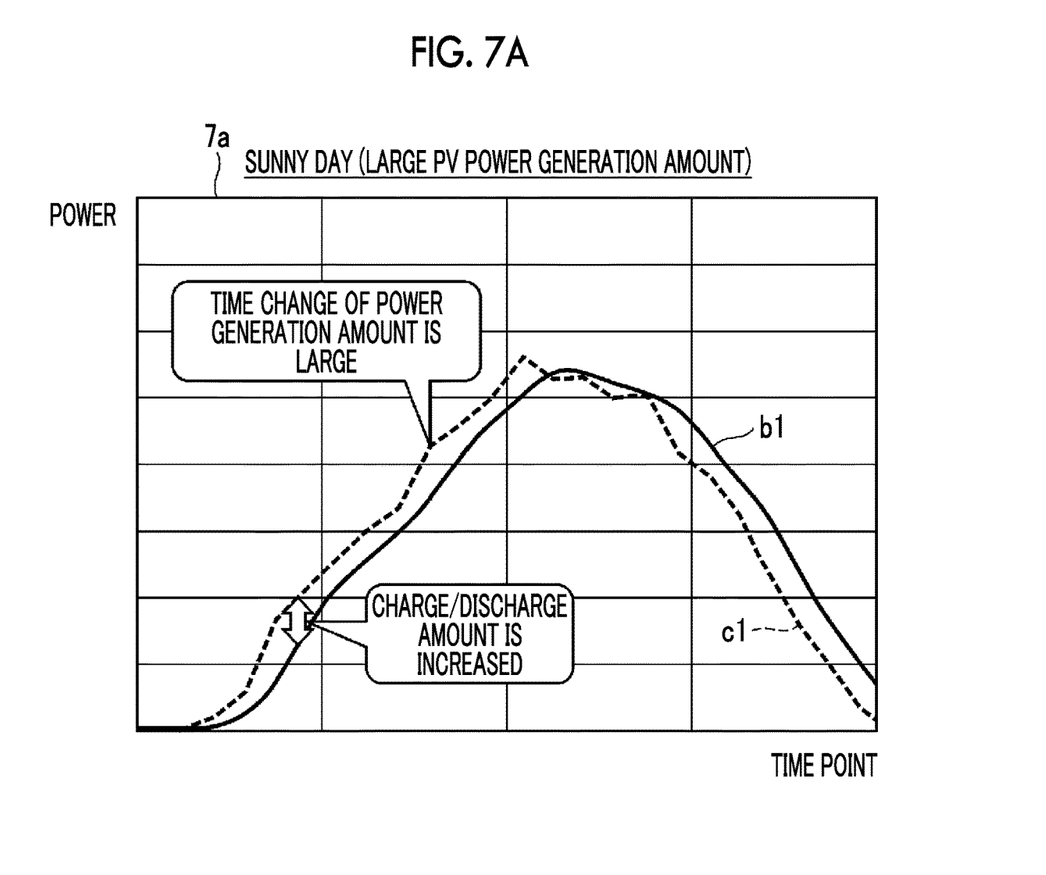
FIG. 7A is a first diagram for describing a relationship between a magnitude of a PV power amount and fluctuation in PV power according to a third embodiment.
Figure 7B:
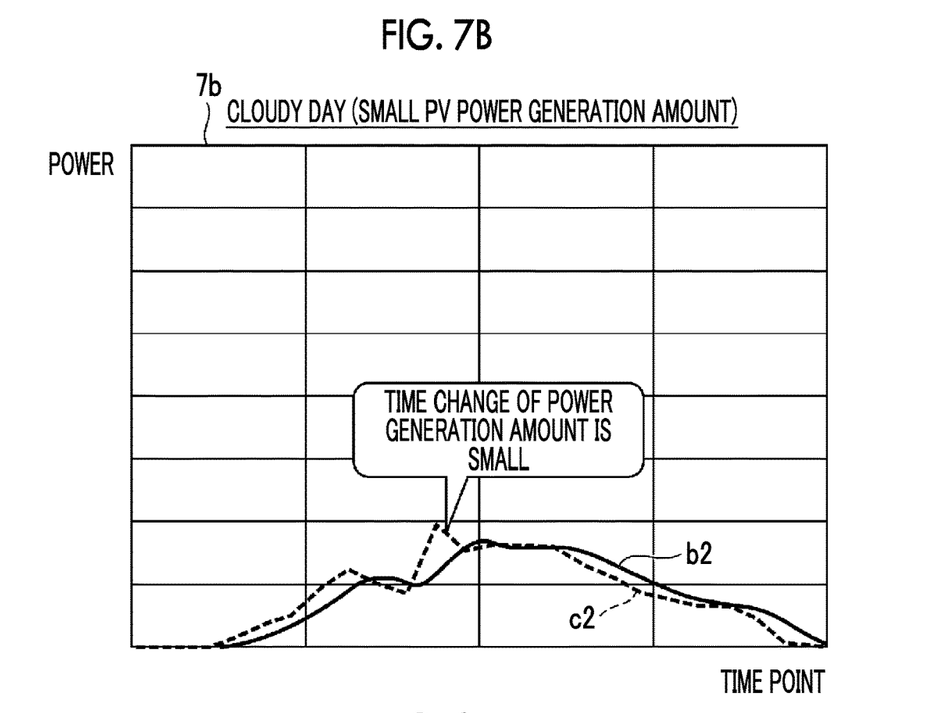
FIG. 7B is a second diagram for describing a relationship between the magnitude of the PV power amount and the fluctuation in the PV power according to the third embodiment.

FIGS. 7A and 7B show a relationship between the magnitude of the PV power generation amount and the fluctuation of the PV power. For example, the renewable-energy power generation system 1 is assumed to include the solar power generation. A graph 7a of FIG. 7A shows transition of the actual value of the PV power and the smoothing target value on a sunny day in a time series. A line b1 shows the transition of the smoothing target value, and a line c1 shows the transition of the PV power. That is, a difference between the line b1 and the line c1 is charge/discharge power of the battery 41. On the other hand, a graph 7b of FIG. 7B shows the transition of the actual value of PV power and the smoothing target value on a cloudy day in a time series. A line b2 shows the transition of the smoothing target value, and a line c2 shows the transition of the PV power. A difference between the line b2 and the line c2 is the charge/discharge power of the battery 41. Here, the sunny day related to the graph 7a is an example of a case where a total of the PV power generation amount (generated power amount in one day) throughout one day is increased. The cloudy day related to the graph 7b is an example of a case where the total of the PV power generation amount throughout one day is reduced. As illustrated, there is a property that a time change of the power generation amount is large in a case where the PV power generation amount is large and the time change of the power generation amount is small in a case where the PV power generation amount is small. On the other hand, a certain amount of the prediction error occurs in the predicted value of the PV power regardless of the weather, and the charging and discharging corresponding to the prediction error are requested. On the contrary, in a case of a method in the related art in which a moving average of the actual value of the PV power is calculated and a value of the moving average is set as the smoothing target value, a difference between the actual value of the PV power and the moving average value of the actual value of the PV power is relatively large on the sunny day (day in which PV power generation amount is increased) on which the time change of the PV power is large, and thus the charge/discharge amount is increased. On the other hand, since the time change of the PV power generation amount is small on the cloudy day (day in which PV power generation amount is small), the difference between the actual value of the PV power and the moving average value of the actual value of the PV power is relatively small, and thus the charge/discharge amount is reduced. In the third embodiment, this property is used to switch the calculation method of the smoothing target value based on the predicted value of the PV power amount of the next day on the previous day. Specifically, a certain threshold value is set and in a case where a prediction result (integrated power generation amount in one day) of the PV power amount of the next day performed on the previous day is equal to or larger than the threshold value, the method of using the predicted value of the PV power is selected. In a case where the prediction result thereof is less than the threshold value, the method of calculating the moving average value of the actual value of the PV power in the related art is selected.

Figure 8:
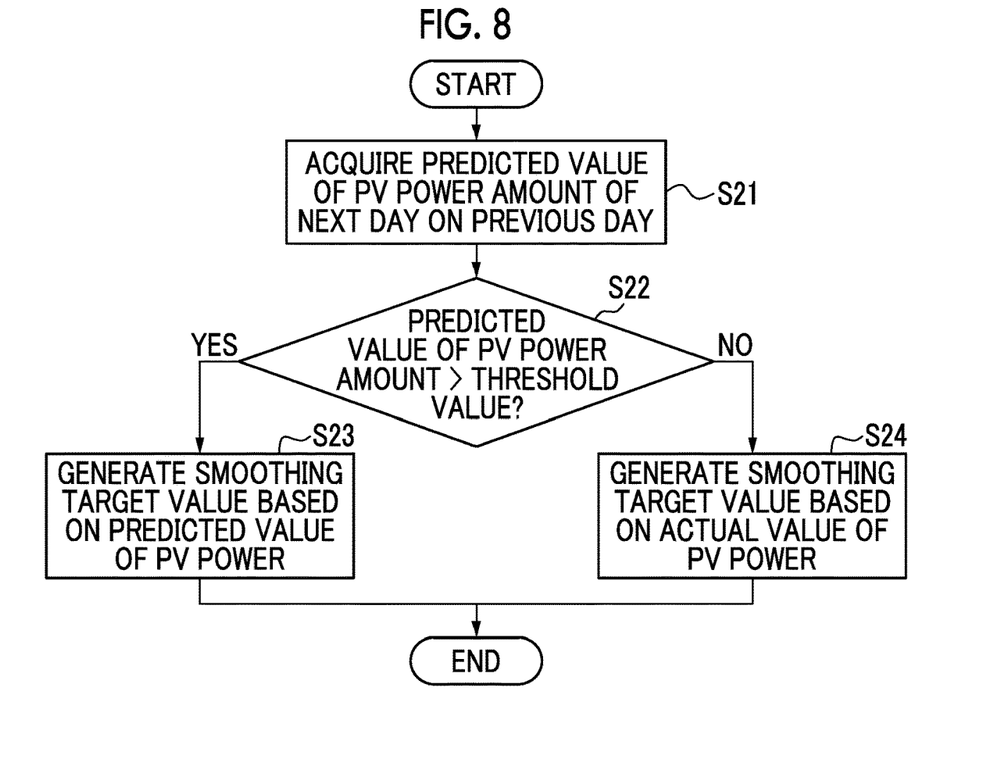
FIG. 8 is a diagram showing an example of a smoothing-target-value calculation process according to the third embodiment.

FIG. 8 shows a smoothing-target-value calculation process in the third embodiment. As a premise, the prediction system 3 predicts the predicted value of the PV power for each predetermined time of the next day at the end of one day based on the actual value of the PV power or the like of the day and integrates the predicted values to predict the predicted value of the PV power amount throughout one day of the next day (that is, day to be controlled for calculating smoothing target value).

The predicted-value acquisition unit 12 acquires the predicted value of the PV power amount of the next day (step S21). Next, the smoothing-target-value calculation unit 15 compares the predicted value of the PV power amount of the next day with a predetermined threshold value to determine whether or not the predicted value of the PV power amount is larger than the threshold value (step S22). In a case where the predicted value of the PV power amount is larger than the threshold value (step S22; Yes), the smoothing-target-value calculation unit 15 decides to calculate the smoothing target value for each predetermined time of the next day based on the predicted value of the PV power (step S23). On the other hand, in a case where the predicted value of the PV power amount is equal to or less than the threshold value (step S22; No), the smoothing-target-value calculation unit 15 decides to calculate the smoothing target value for each predetermined time of the next day based on the actual value of the PV power (step S24).

In the case of the method of calculating the smoothing target value based on the predicted value of the PV power, the charge/discharge amount may increase (degradation may progress) due to the influence of the prediction error, as compared with the method in the related art (moving average value of the actual value or the like is set as the smoothing target value). On the contrary, with the use of the method in the related art in a case where the fluctuation of the generated power is small throughout one day, it is possible to calculate the smoothing target value with high accuracy. In the present embodiment, the day in which the fluctuation of the generated power is small throughout one day is considered to be a day in which the PV power amount in one day is small, and the smoothing target value is calculated using the method in the related art on the day in which the PV power amount is small. Accordingly, it is possible to further suppress the degradation of the battery.

Fourth Embodiment

Figure 9:
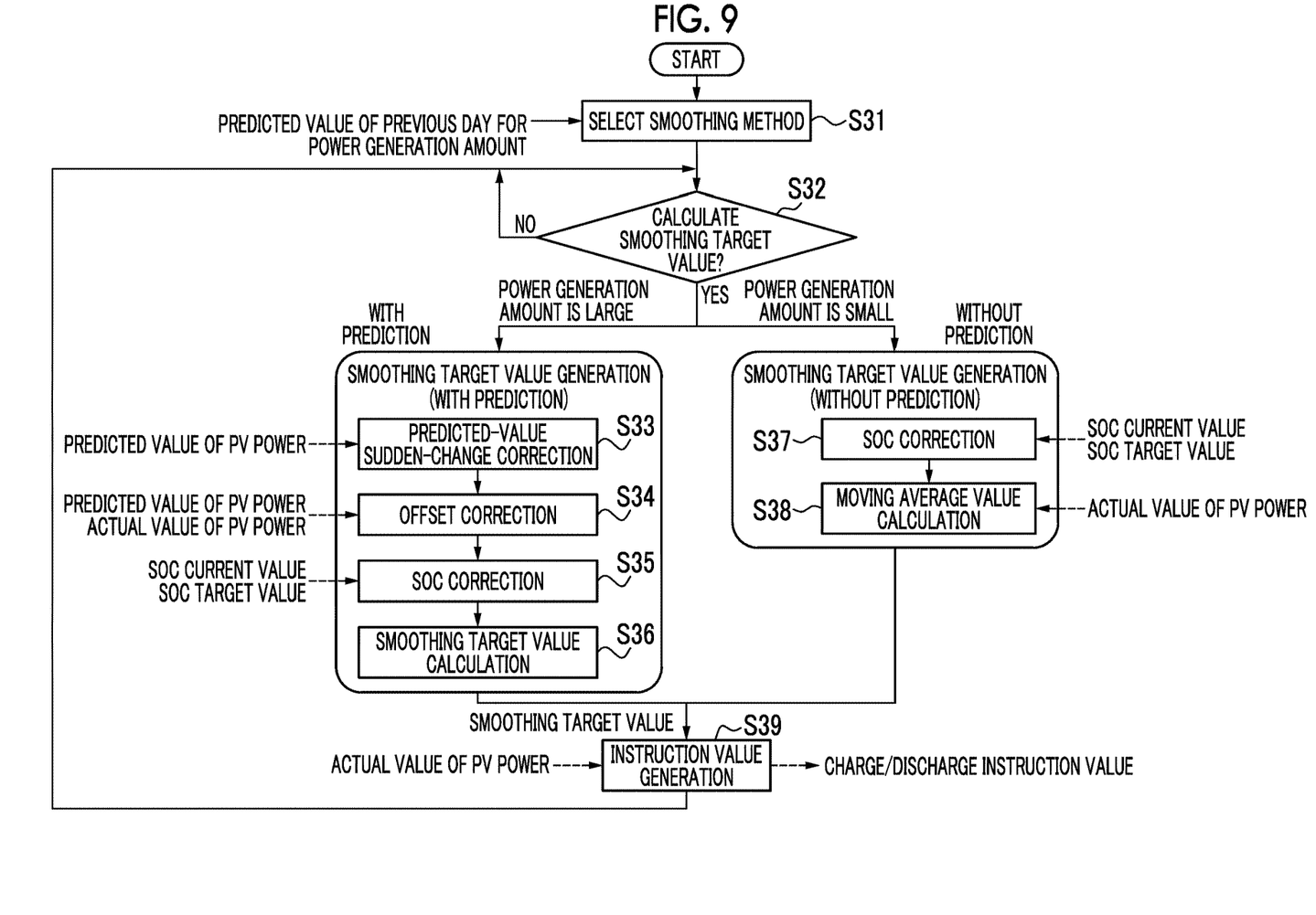
FIG. 9 is a diagram showing an example of a smoothing-target-value calculation process according to a fourth embodiment.

A process example in a case where the first embodiment to the third embodiment are combined is shown in FIG. 9 as a fourth embodiment. According to the fourth embodiment, the degradation of the battery 41 can be suppressed while smoothing the power supplied from the renewable-energy power generation system 1.

FIG. 9 is a diagram showing an example of a smoothing-target-value calculation process according to the fourth embodiment.

First, the smoothing-target-value calculation unit 15 selects a smoothing method by the process described in the third embodiment (FIG. 8), based on the predicted value of the previous day for the power generation amount generated by the renewable-energy power generation system 1 on the current day to be controlled (step S31). Next, the smoothing-target-value calculation unit 15 determines whether or not to calculate the smoothing target value (step S32). For example, in a case where the smoothing target value is calculated based on the actual value of the PV power every 30 minutes, the smoothing-target-value calculation unit 15 waits until a timing for calculating the smoothing target value arrives (step S32; No). In a case where the timing for calculating the smoothing target value arrives, the smoothing-target-value calculation unit 15 calculates the smoothing target value by the method selected in step S31.

In a case where the method of calculating the smoothing target value based on the predicted value is selected in step S31 (in a case where the power generation amount in one day is large), the smoothing-target-value calculation unit 15 calculates the smoothing target value based on the predicted value of the PV power. Specifically, the predicted-value acquisition unit 12 acquires the predicted value of the PV power for each predetermined time (for example, every 30 minutes), and the actual-value acquisition unit 11 and the SOC acquisition unit 13 respectively acquire the latest actual value of the PV power and the latest SOC of the battery 41. The sudden-change correction unit 152 executes the predicted-value sudden-change correction based on the predicted value of the PV power by the process described with reference to FIG. 6 (step S33). Next, the offset correction unit 151 executes the offset correction for each predetermined time based on the predicted value and the actual value of the PV power by the process described with reference to FIG. 3 (step S34).

Next, the SOC correction unit 154 executes the SOC correction for each predetermined time based on a current value of the SOC of the battery 41 acquired by the SOC acquisition unit 13 and a predetermined SOC target value (step S35). For example, in a case where the current SOC of the battery 41 is lower than the target value, it is appropriate to charge the battery 41. The SOC correction unit 154 corrects the predicted value of the PV power after the offset correction to a smaller value such that only insufficient SOC can be charged or the SOC can be suppressed from further lowering. For example, the SOC correction unit 154 calculates SOC correction power by multiplying the power corresponding to the SOC, which is insufficient for the target value, by a predetermined coefficient and subtracts the SOC correction power from the predicted value, after the predetermined time (for example, three frames ahead), of the PV power after the offset correction. On the contrary, in a case where the current SOC of the battery 41 is higher than the target value, it is appropriate to discharge the battery 41. The SOC correction unit 154 calculates the SOC correction power by multiplying the power corresponding to surplus SOC by a predetermined coefficient such that only surplus SOC can be discharged or the SOC can be suppressed from further increasing and adds the SOC correction power to the predicted value, after the predetermined time, of the PV power after the offset correction. With the SOC correction together with the offset correction, it is possible to control the SOC of the battery 41 within the use range and thus suppress the degradation of the battery 41. In a case where the predicted value of the PV power after the predetermined time is corrected by these processes, the predicted-value smoothing unit 153 performs the smoothing process by the process described with reference to FIG. 3 to calculate the smoothing target value (step S36).

In a case where the method in the related art is selected (in a case where the power generation amount in one day is small) as a result of step S31, the smoothing-target-value calculation unit 15 calculates the smoothing target value based on the actual value of the PV power. Specifically, the actual-value acquisition unit 11 and the SOC acquisition unit 13 respectively acquire the latest actual value of the PV power and the latest SOC of the battery 41 in a cycle of one second, for example. The SOC correction unit 154 performs the SOC correction on the actual value of the PV power (step S37). Next, the actual-value smoothing unit 155 calculates the moving average value using the actual value of the PV power after the SOC correction and calculates the smoothing target value (step S38). The smoothing-target-value calculation unit 15 repeatedly executes the processes of steps S37 to S38 at a predetermined control cycle.

Next, the instruction-value generation unit 14 generates the charge/discharge instruction value for the battery system 4 from the difference between the smoothing target value calculated by any of the methods and the actual value of the PV power acquired by the actual-value acquisition unit 11 (step S39). This value indicates an instruction value of the charge/discharge power for the smoothing system 2. A positive value of the charge/discharge instruction value indicates discharging, and a negative value thereof indicates charging. In the battery system 4, the control device 42 controls the charging and discharging of the battery 41 based on a charge/discharge instruction. Accordingly, the power supplied to the load is controlled to the power indicated by the smoothing target value.

(Effects)

As described above, according to the present embodiment, it is possible to suppress the degradation of the battery 41 provided with the smoothing system 2 while smoothing the power generated by the renewable-energy power generation system 1 by the smoothing system 2. More specifically, with the prediction of the power generated by the renewable-energy power generation system 1 and the offset correction on the prediction result based on the actual value immediately before, it is possible to suppress the charge/discharge amount of the battery 41 and suppress the deviation of the use range of the battery 41. With the execution of the SOC correction in addition to the offset correction, it is possible to more effectively prevent the deviation of the use range of the battery 41 and contribute to the suppression of degradation of the battery. With the predicted-value sudden-change correction, it is possible to avoid the unnecessary charge/discharge amount of the battery 41. With the switching of the calculation method of the smoothing target value based on the prediction of the previous day for the power generation amount of the renewable-energy power generation system 1, it is possible to reduce the difference between the smoothing target value and the actual PV power and suppress the charge/discharge amount and the degradation of the battery 41.

Figure 10:
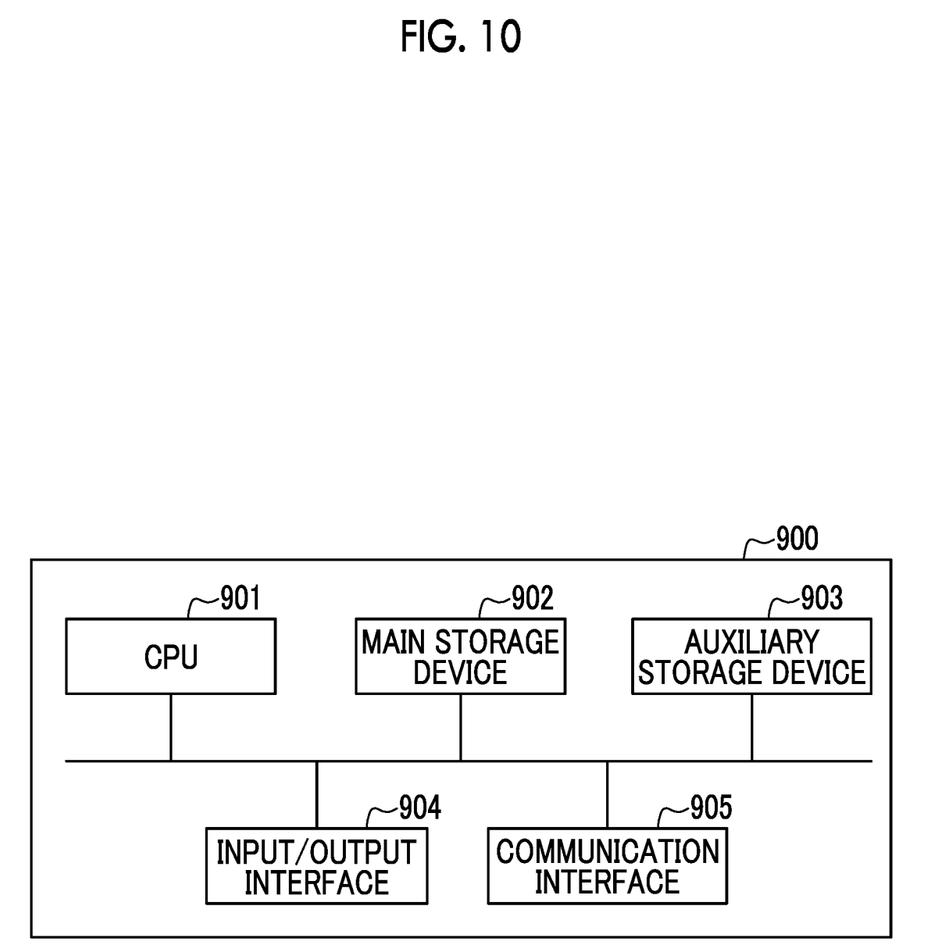
FIG. 10 is a diagram showing an example of a hardware configuration of a smoothing-target-value calculation device according to each embodiment.

FIG. 10 is a diagram showing an example of a hardware configuration of a smoothing-target-value calculation device according to each embodiment.

A computer 900 is provided with a CPU 901, a main storage device 902, an auxiliary storage device 903, an input/output interface 904, and a communication interface 905.

The smoothing-target-value calculation device 10 is mounted on the computer 900. Each of the functions described above is stored in the auxiliary storage device 903 in a program form. The CPU 901 reads out the program from the auxiliary storage device 903, expands the program in the main storage device 902, and executes the above process according to the program. The CPU 901 ensures a storage area in the main storage device 902 according to the program. The CPU 901 ensures a storage area for storing data being processed in the auxiliary storage device 903 according to the program.

The process by each functional unit may be performed by recording a program for realizing all or a part of the functions of the smoothing-target-value calculation device 10 on a computer-readable recording medium and by causing a computer system to read the program recorded on the recording medium. The "computer system" herein includes an OS and hardware such as a peripheral device. The "computer system" also includes a homepage providing environment (or display environment) in a case where a WWW system is used. The "computer-readable recording medium" refers to a portable medium such as a CD, a DVD, or a USB, or a storage device such as a hard disk built into the computer system. In a case where this program is distributed to the computer 900 by a communication line, the computer 900 that receives the distribution may expand the program in the main storage device 902 and execute the above process. The above program may be for realizing a part of the above functions, or may further realize the above functions in combination with a program already recorded in the computer system.

As described above, although some embodiments according to the present disclosure have been described, all of these embodiments are presented as examples and are not intended to limit the scope of the invention. These embodiments can be implemented in various other forms, and various omissions, replacements, and changes can be made without departing from the gist of the invention. These embodiments and variations thereof are included in the scope of the invention described in the claims and the equivalent scope thereof, as well as in the scope and gist of the invention.

<Additional Notes>

The smoothing-target-value calculation device, the power supply system, the smoothing-target-value calculation method, and the program described in each embodiment are grasped as follows, for example.

(1) A smoothing-target-value calculation device according to a first aspect is a smoothing-target-value calculation device 10 that calculates a smoothing target value, which is a target value of power obtained by totaling first power generated by a renewable-energy power generation system and second power charged and discharged by a battery, the device including a predicted-value acquisition unit 12 that acquires a predicted value of the first power, a predicted-value correction unit (offset correction unit 151, sudden-change correction unit 152, SOC correction unit 154) that corrects the predicted value, and a smoothing-target-value calculation unit (predicted-value smoothing unit 153) that smooths the predicted value after the correction to calculate the smoothing target value.

With the correction of the predicted value and the smoothing of the predicted value after the correction to calculate the smoothing target value, it is possible to calculate the smoothing target value with a small charge/discharge amount.

(2) A smoothing-target-value calculation device according to a second aspect is the smoothing-target-value calculation device of (1), in which, for a first predicted value, a second predicted value, and a third predicted value that are the predicted values in respective consecutive times of a first time, a second time, and a third time, in a case where a difference between the second predicted value and an average value of the first predicted value and the third predicted value is equal to or larger than a predetermined threshold value, the predicted-value correction unit (sudden-change correction unit 152) corrects the second predicted value to a value based on the average value of the first predicted value and the third predicted value.

Accordingly, it is possible to avoid extra charging and discharging caused by a sudden change in the predicted value of the PV power while the actual PV power shows a gentle change.

(3) A smoothing-target-value calculation device according to a third aspect is the smoothing-target-value calculation device according to (1) to (2), in which in the predicted-value correction unit (offset correction unit 151), a value obtained by multiplying a difference between the predicted value in a past fourth time and an actual value of the first power by a predetermined coefficient is added to or subtracted from the predicted value in a fifth time after a predetermined time from the fourth time to correct the predicted value in the fifth time.

The future predicted value is corrected based on the tendency of the difference between the predicted value and the actual value of the past PV power. Accordingly, in a case where the predicted value especially tends to exceed or fall below the actual value, it is possible to bring the predicted value of the PV power close to the actual value and thus reduce the charge/discharge amount of the battery.

(4) A smoothing-target-value calculation device according to a fourth aspect is the smoothing-target-value calculation device according to (1) to (3), in which, for a sixth predicted value, a seventh predicted value, and an eighth predicted value that are the predicted values after the correction in respective consecutive times of a sixth time, a seventh time, and an eighth time, the smoothing-target-value calculation unit sets an average value of the sixth predicted value and the seventh predicted value as the smoothing target value at a start time point of the seventh time, sets an average value of the seventh predicted value and the eighth predicted value as the smoothing target value at an end time point of the seventh time, and sets a value indicated by a line formed by connecting the smoothing target value at the start time point of the seventh time and the smoothing target value at the end time point of the seventh time as the smoothing target value at each time point of the seventh time.

Accordingly, it is possible to calculate the smoothing target value in a time series based on the average value of the predicted value after the correction. With the use of the average value of the predicted value after the correction, even in a case where the predicted value after the correction deviates slightly from the actual PV power, it is possible to keep the difference within an intermediate range.

(5) A smoothing-target-value calculation device according to a fifth aspect is the smoothing-target-value calculation device according to (1) to (4), the device further including a method selection unit (smoothing-target-value calculation unit 15) that selects a method of calculating the smoothing target value, in which the method selection unit selects, in a case where a daily total of the predicted values of the first power exceeds a threshold value, a method in which the predicted value is corrected by the predicted-value correction unit and the predicted value after the correction is smoothed by using the smoothing-target-value calculation unit to calculate the smoothing target value, and selects, in a case where the daily total of the predicted values of the first power is equal to or less than the threshold value, a method in which a moving average value of an actual value of the first power is calculated to calculate the smoothing target value.

Accordingly, in a case where the fluctuation of the PV power in one day is estimated to be small, with the smoothing (calculation of moving average value) of the actual value of the PV power in the predetermined time immediately before to calculate the smoothing target value, it is possible to calculate the smoothing target value with good accuracy (close to actual PV power) and thus expect the reduction in the charge/discharge amount. On the contrary, in a case where the fluctuation of the PV power in one day is estimated to be large, the smoothing target value is calculated based on a value obtained by further correcting the predicted value of the PV power that can predict the PV power more accurately than the smoothing target value based on the actual value of the PV power. Accordingly, it is possible to reduce the charge/discharge amount from the battery.

(6) A smoothing-target-value calculation device according to a sixth aspect is a smoothing-target-value calculation device that calculates a smoothing target value, which is a target value of power obtained by totaling first power generated by a renewable-energy power generation system and second power charged and discharged by a battery, the device including a method selection unit that selects a method of calculating the smoothing target value, in which the method selection unit selects, in a case where a daily total of the predicted values of the first power exceeds a threshold value, a method in which the predicted value is smoothed to calculate the smoothing target value, and selects, in a case where the daily total of the predicted values of the first power is equal to or less than the threshold value, a method in which a moving average value of an actual value of the first power is calculated to calculate the smoothing target value.

Accordingly, in a case where the fluctuation of the PV power in one day is estimated to be small, with the smoothing (calculation of moving average value) of the actual value of the PV power in the predetermined time immediately before to calculate the smoothing target value, it is possible to calculate the smoothing target value with good accuracy (close to actual PV power) and thus expect the reduction in the charge/discharge amount. On the contrary, in a case where the fluctuation of the PV power in one day is estimated to be large, the PV power is predicted based on the prediction model 31 that can predict the PV power more accurately than the smoothing target value based on the actual value of the PV power and the smoothing target value is calculated based on the predicted value of the PV power. Accordingly, it is possible to reduce the charge/discharge amount from the battery.

(7) A power supply system according to a seventh aspect includes a renewable-energy power generation system, a battery system that charges and discharges a battery to compensate for output fluctuation of the renewable-energy power generation system, and the smoothing-target-value calculation device according to any one of (1) to (6), in which the battery system charges and discharges the battery based on a difference between the smoothing target value calculated by the smoothing-target-value calculation device and power generated by the renewable-energy power generation system.

Accordingly, it is possible to suppress the degradation of the battery while suppressing the output fluctuation of the renewable-energy power generation.

(8) A smoothing-target-value calculation method according to an eighth aspect is a smoothing-target-value calculation method of calculating a smoothing target value, which is a target value of power obtained by totaling first power generated by a renewable-energy power generation system and second power charged and discharged by a battery, the method including a step of acquiring a predicted value of the first power, a step of correcting the predicted value, and a step of smoothing the predicted value after the correction to calculate the smoothing target value.

(9) A program according to a ninth aspect causes a computer that calculates a smoothing target value, which is a target value of power obtained by totaling first power generated by a renewable-energy power generation system and second power charged and discharged by a battery, to execute a step of acquiring a predicted value of the first power, a step of correcting the predicted value, and a step of smoothing the predicted value after the correction to calculate the smoothing target value.

INDUSTRIAL APPLICABILITY

With the smoothing-target-value calculation device, the power supply system, the smoothing-target-value calculation method, and the program, it is possible to suppress the degradation of the secondary battery while achieving the output fluctuation suppression of the renewable-energy power generation.

REFERENCE SIGNS LIST

100: power supply system
1: renewable-energy power generation system
2: smoothing system
3: prediction system
31: prediction model
4: battery system
41: battery
42: control device
10: smoothing-target-value calculation device
11: actual-value acquisition unit
12: predicted-value acquisition unit
13: SOC acquisition unit
14: instruction-value generation unit
15: smoothing-target-value calculation unit
151: offset correction unit
152: sudden-change correction unit
153: predicted-value smoothing unit
154: SOC correction unit
155: actual-value smoothing unit
900: computer
901: CPU
902: main storage device
903: auxiliary storage device
904: input/output interface
905: communication interface

The invention claimed is:

1. A smoothing-target-value calculation device that calculates a smoothing target value, which is a target value of power obtained by totaling first power generated by a renewable-energy power generation system and second power charged and discharged by a battery, the device comprising:
   a predicted-value acquisition unit that acquires a predicted value of the first power;
   a predicted-value correction unit that corrects the predicted value; and
   a smoothing-target-value calculation unit that smooths the predicted value after the correction to calculate the smoothing target value.

2. The smoothing-target-value calculation device according to claim 1,
   wherein, for a first predicted value, a second predicted value, and a third predicted value that are the predicted values in respective consecutive times of a first time, a second time, and a third time, in a case where a difference between the second predicted value and an average value of the first predicted value and the third predicted value is equal to or larger than a predetermined threshold value, the predicted-value correction unit corrects the second predicted value to a value based on the average value of the first predicted value and the third predicted value.

3. The smoothing-target-value calculation device according to claim 1,
wherein in the predicted-value correction unit, a value obtained by multiplying a difference between the predicted value in a past fourth time and an actual value of the first power by a predetermined coefficient is added to or subtracted from the predicted value in a fifth time after a predetermined time from the fourth time to correct the predicted value in the fifth time.

4. The smoothing-target-value calculation device according to claim 1,
wherein, for a sixth predicted value, a seventh predicted value, and an eighth predicted value that are the predicted values after the correction in respective consecutive times of a sixth time, a seventh time, and an eighth time, the smoothing-target-value calculation unit sets an average value of the sixth predicted value and the seventh predicted value as the smoothing target value at a start time point of the seventh time, sets an average value of the seventh predicted value and the eighth predicted value as the smoothing target value at an end time point of the seventh time, and sets a value indicated by a line formed by connecting the smoothing target value at the start time point of the seventh time and the smoothing target value at the end time point of the seventh time as the smoothing target value at each time point of the seventh time.

5. The smoothing-target-value calculation device according to claim 1, further comprising:
a method selection unit that selects a method of calculating the smoothing target value,
wherein the method selection unit selects, in a case where a daily total of the predicted values of the first power exceeds a threshold value, a method in which the predicted value is corrected by the predicted-value correction unit and the predicted value after the correction is smoothed by using the smoothing-target-value calculation unit to calculate the smoothing target value, and
selects, in a case where the daily total of the predicted values of the first power is equal to or less than the threshold value, a method in which a moving average value of an actual value of the first power is calculated to calculate the smoothing target value.

6. A power supply system comprising:
a renewable-energy power generation system;
a battery system that charges and discharges a battery to compensate for output fluctuation of the renewable-energy power generation system; and
the smoothing-target-value calculation device according to claim 1,
wherein the battery system charges and discharges the battery based on a difference between the smoothing target value calculated by the smoothing-target-value calculation device and power generated by the renewable-energy power generation system.

7. A smoothing-target-value calculation device that calculates a smoothing target value, which is a target value of power obtained by totaling first power generated by a renewable-energy power generation system and second power charged and discharged by a battery, the device comprising:
a method selection unit that selects a method of calculating the smoothing target value,
wherein the method selection unit selects, in a case where a daily total of the predicted values of the first power exceeds a threshold value, a method in which the predicted value is smoothed to calculate the smoothing target value, and
selects, in a case where the daily total of the predicted values of the first power is equal to or less than the threshold value, a method in which a moving average value of an actual value of the first power is calculated to calculate the smoothing target value.

8. A smoothing-target-value calculation method of calculating a smoothing target value, which is a target value of power obtained by totaling first power generated by a renewable-energy power generation system and second power charged and discharged by a battery, the method comprising:
a step of acquiring a predicted value of the first power;
a step of correcting the predicted value; and
a step of smoothing the predicted value after the correction to calculate the smoothing target value.

9. A non-transitory computer readable medium storing a program causing a computer that calculates a smoothing target value, which is a target value of power obtained by totaling first power generated by a renewable-energy power generation system and second power charged and discharged by a battery, to execute:
a step of acquiring a predicted value of the first power;
a step of correcting the predicted value; and
a step of smoothing the predicted value after the correction to calculate the smoothing target value.

* * * * *